United States Patent
Hsu

(10) Patent No.: US 8,110,896 B2
(45) Date of Patent: Feb. 7, 2012

(54) SUBSTRATE STRUCTURE WITH CAPACITOR COMPONENT EMBEDDED THEREIN AND METHOD FOR FABRICATING THE SAME

(75) Inventor: Shih-Ping Hsu, Hsin-chu (TW)

(73) Assignee: Unimicron Technology Corp., Taoyuan (TW)

( * ) Notice: Subject to any disclaimer, the term of this patent is extended or adjusted under 35 U.S.C. 154(b) by 1444 days.

(21) Appl. No.: 11/472,759

(22) Filed: Jun. 21, 2006

(65) Prior Publication Data
US 2007/0143993 A1    Jun. 28, 2007

(30) Foreign Application Priority Data

Dec. 27, 2005  (TW) ................................ 94146634 A

(51) Int. Cl.
*H01L 27/01* (2006.01)
(52) U.S. Cl. ................ 257/532; 257/E23.178; 361/763; 361/782
(58) Field of Classification Search .................. 257/532, 257/E29.343, E23.178; 438/381, 393; 361/763, 361/782
See application file for complete search history.

(56) References Cited

U.S. PATENT DOCUMENTS

| | | | | |
|---|---|---|---|---|
| 6,724,638 | B1 * | 4/2004 | Inagaki et al. | 361/763 |
| 6,759,257 | B2 * | 7/2004 | McCormack et al. | 438/15 |
| 7,025,607 | B1 * | 4/2006 | Das et al. | 439/91 |
| 7,100,277 | B2 * | 9/2006 | Borland et al. | 29/832 |
| 2002/0145197 | A1 * | 10/2002 | Ohta et al. | 257/734 |
| 2004/0118600 | A1 * | 6/2004 | Lee et al. | 174/260 |
| 2004/0150966 | A1 * | 8/2004 | Hu | 361/763 |
| 2004/0231885 | A1 * | 11/2004 | Borland et al. | 174/260 |

* cited by examiner

*Primary Examiner* — Mary Wilczewski
*Assistant Examiner* — Toniae Thomas
(74) *Attorney, Agent, or Firm* — Sawyer Law Group, P.C.

(57) ABSTRACT

A capacitor components embedded substrate structure comprises a substrate, capacitor components, a first and second dielectric layers, and a circuit layer. The substrate includes a first surface, a second surface, and a hole penetrating the first and the second surfaces. The capacitor components whose surface is pretreated with a roughness process is received in the hole of the substrate, such that at least one surface of the capacitor components is disposed with a plurality of electrode pads. The first and the second dielectric layers are formed on the surface of substrate and the surface of the capacitor components respectively such that the capacitor components are secured in position in the hole of the substrate. The first and the second dielectric layers have a plurality of openings to expose the electrode pads of the capacitor components. The circuit layer is formed on the surface of the first and second dielectric layers, and a conductive structure is formed in the opening of the first and second dielectric layers for electrically connecting the circuit layer to the electrode pads of the capacitor components. The present invention further provides a method for fabricating a capacitor components embedded substrate structure. The capacitor components embedded substrate structure and the method for fabricating the same of the present invention reinforces the bonding strength between the capacitor components and the substrate, reduces substrate package sizes, and allows circuit layout design to be more flexible.

4 Claims, 4 Drawing Sheets

SUBSTRATE STRUCTURE WITH CAPACITOR COMPONENT EMBEDDED THEREIN AND METHOD FOR FABRICATING THE SAME

CROSS-REFERENCE TO RELATED APPLICATION

This application claims benefit under 35 USC 119 to Taiwan Application No. 094146634, filed Dec. 27, 2005.

FIELD OF THE INVENTION

The present invention relates to a capacitor components embedded substrate structure and a method for fabricating the same, and more particularly, to a substrate structure in which capacitor components pretreated with a surface roughness process are embedded and a method for fabricating the same.

BACKGROUND OF THE INVENTION

With the advancement in semi-conductor fabricating technology and the push for upgrade in semiconductor chip circuitry capability, the trend of semiconductor packaging moves towards high integration. The Ball Grid Array (BGA) packaging method and the FCBGA packaging method are currently replacing the traditional semiconductor package with a lead frame. BGA packaging method allows for more I/O connections per unit surface thus allowing more circuitry and semiconductor chips to be accommodated therein.

However as the semiconductor packaging becomes highly integrated, the number of connection leads also increases. This along with the increased number of semiconductor circuitry results in a corresponding increase in noises. Typically to eliminate these noises or to achieve electrical performance compensation, a way is to embed passive components, such as capacitor components, into the semiconductor package so as to stabilize the circuitry and allow the semiconductor package to meet the requirement of satisfactory electrical performance.

Conventionally, this is achieved by mounting capacitor components on the surface of a substrate. However the substrate structure when subjected to external environmental factor such as external vibration, the capacitor component may become dislodged due to weak bonding strength. Furthermore, typically in order to avoid capacitor component from obstructing the electrical connection between the semiconductor component and solder pad, the capacitor components are placed on surface areas of the substrate structure which are not occupied by the circuitry. This method requires larger substrate surface area resulting in an increase in the package size. Furthermore as capacitor components have to be separately mounted onto the substrate structure, this method also increases the complexity of the chip circuitry and the fabricating process.

Referring to FIG. 1, a plurality of capacitor components 12 are disposed on the surface of a substrate 1. The substrate 1 can be a typical printed circuit board or semiconductor substrate, however in order to avoid the capacitor components 12 from obstructing the electrical connections between the semiconductor chip 11 and a plurality of solder pads, the conventional way is to dispose the capacitor components 12 on the edge of the substrate surface or on the substrate surface outside the semiconductor chip mounting region whereon the semiconductor chip is to be mounted. However, as the positions of the solder pads must be considered, the disposition positions and numbers of the capacitor components 12 are limited. As the requirement for high electrical performance increases, the number of capacitor components required also increases. It is therefore unavoidable to increase the size of the package using the conventional method to dispose semiconductor chips 11 and a large number of capacitor components 12 on the substrate surface, thereby contradicting the trend towards miniaturization. In addition, this type of substrate structure is designed for a single electrical function, and is not flexibly modified to adapt and incorporate other electrical components or semiconductor component, as such when there is a need for a different capacitor component with different capacitance values, a new substrate structure 1 has to be designed. This results in an increase in complexity of the fabricating process of semiconductor.

As such, considering the trend of electronic product towards miniaturization, multiple functionalities and high electrical performance, the ability to embed sufficient numbers of capacitor components on a substrate structure, and increase the capacitor components and the substrate structure bonding strength, the ability to improve the capacitor components flexibility for change and also the flexibility for modification to the substrate structure circuitry design is therefore a topic needing urgent resolution.

SUMMARY OF THE INVENTION

In the view of prior art drawbacks, the primary objective of this invention is to provide a substrate structure having capacitor components embedded therein and a method for fabricating the same, wherein the surface of the capacitor components are pretreated with a surface roughness process before embedding in the substrate so to improve the bonding strength between the capacitor components and the substrate.

Another objective of the invention is to provide a substrate structure having capacitor components embedded therein and a method for fabricating the same, wherein the space of the substrate is effectively used and the size of the substrate is desirably reduced.

Still another objective of the invention is to provide a substrate structure having capacitor component embedded therein and a method for fabricating the same, wherein the capacitance values of the capacitor components and circuitry layout of the substrate can be flexibly changed according to practical needs.

A further objective of the invention is to provide a capacitor components embedded substrate structure and a method for fabricating the same, wherein the capacitor components are embedded in the substrate to form a module, thereby simplifying the fabricating process.

To achieve the above and other objectives, the fabricating method of the capacitor components embedded substrate structure proposed by the present invention comprises the steps of: providing a substrate and capacitor components, wherein the substrate has a first surface, a second surface, and at least one hole penetrating the first and second surfaces, a plurality of corresponding electrode pads are disposed on at least one surface of the capacitor components, the surface of the capacitor components is pretreated with a surface roughness process before or after the capacitor components are embedded in the holes of the substrate; forming first and second dielectric layers on the surfaces of the substrate and the capacitor components, allowing the opening of the substrate to be filled with the second dielectric layer so as to secure in position the capacitor components in the holes of the substrate, wherein a plurality of openings are formed in the first and second dielectric layer for exposing the electrode pads of the capacitor components thereto; forming a circuit layer on the surface of the first and second dielectric layer and conductive structures in the openings of the first and second dielectric layer to allow the circuit layer to be electrically connected to the electrode pads of the capacitor components.

The side of the capacitor components further comprises a metallic layer, which is pretreated with a surface roughness process so as to increase the bonding strength between the capacitor components and the substrate. The substrate may be either a multilayer circuit board comprising at least two circuit layers, insulating board or metallic board. The material of the first and second dielectric layer is selected from a group comprising a prepreg that contains high resin level, dielectric film or a combination of prepreg and dielectric film.

The foregoing method for fabricating the capacitor components embedded substrate structure comprises the steps of: forming a circuit build-up structure on the surface of the first and second dielectric layers, having a plurality of conductive structures therein and a plurality of electrical connection pads on the surface thereof, wherein the circuit build-up structure is electrically connected to the circuit layers; forming a solder mask layer on the surface of the circuit build up structure with a plurality of openings on the surface thereof so as to expose the electrical connection pads of the circuit build-up structure; and forming a plurality of plated through holes penetrating through the circuit layers on the first and second dielectric layer. The circuit build-up structure further comprises dielectric layers, circuit layers stacked on the dielectric layers and conductive structures formed within the dielectric layers.

The capacitor components embedded substrate structure formed by the foregoing fabrication method of the present invention comprises: a substrate having a first surface, a second surface, and at least one hole penetrating the first and second surfaces; capacitor components received in the holes of the substrate, wherein at least one surface of the capacitor components have a plurality of electrode pads and the surface of the capacitor components are pretreated with a surface roughness process; first and second dielectric layers having a plurality of openings formed on the surfaces of the substrate and capacitor components, allowing the capacitor components to be secured in position in the holes of the substrate in such a way that the electrode pads of the capacitor components are exposed to the openings of the first and second dielectric layers; and circuit layers formed on the surfaces of the first and second dielectric layers, wherein conductive structures are formed in the openings of the first and second dielectric layers, allowing the circuit layers to be electrically connected to the electrode pads of the capacitor components.

The side of the capacitor components further comprises a metallic layer, which is pretreated with a surface roughness process for increasing the bonding strength between the capacitor components and the substrate.

The forgoing substrate structure having embedded capacitor components further comprises a circuit build-up structure formed on the surface of the first and second dielectric layers and the circuit layers, electrically connected to the circuit layers and formed with a plurality of conductive structures on the surface thereof; solder mask layers formed on the surface of the circuit build-up structure with a plurality of openings on the surface thereof so as to expose the electrical connection pads of the circuit build-up structure; and a plurality of plated through holes (PTH) penetrating through the circuit layers on the first and second dielectric layer.

The capacitor components embedded substrate structure and the method for fabricating the same involves performing a surface roughness process on the surfaces of the capacitor components so as to improve the bonding strength between the capacitor components and the substrate. The capacitor components are secured in position by filling the gap between the capacitor components and the substrate with the first and second dielectric layers. Then circuit layers are formed on the first and second dielectric layers so as to form a module structure. Since the capacitor components are embedded within the substrate, the space within the substrate is fully utilized, which is beneficial in miniaturization of package size. Moreover, since the capacitor components have a plurality of electrode pads, capacitance value can be flexibly modified according to practical needs, thereby improving the flexibility of circuitry layout. Furthermore the module structure also allows it to be integrated with other electrical components or semiconductor devices, thereby simplifying the fabricating process.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
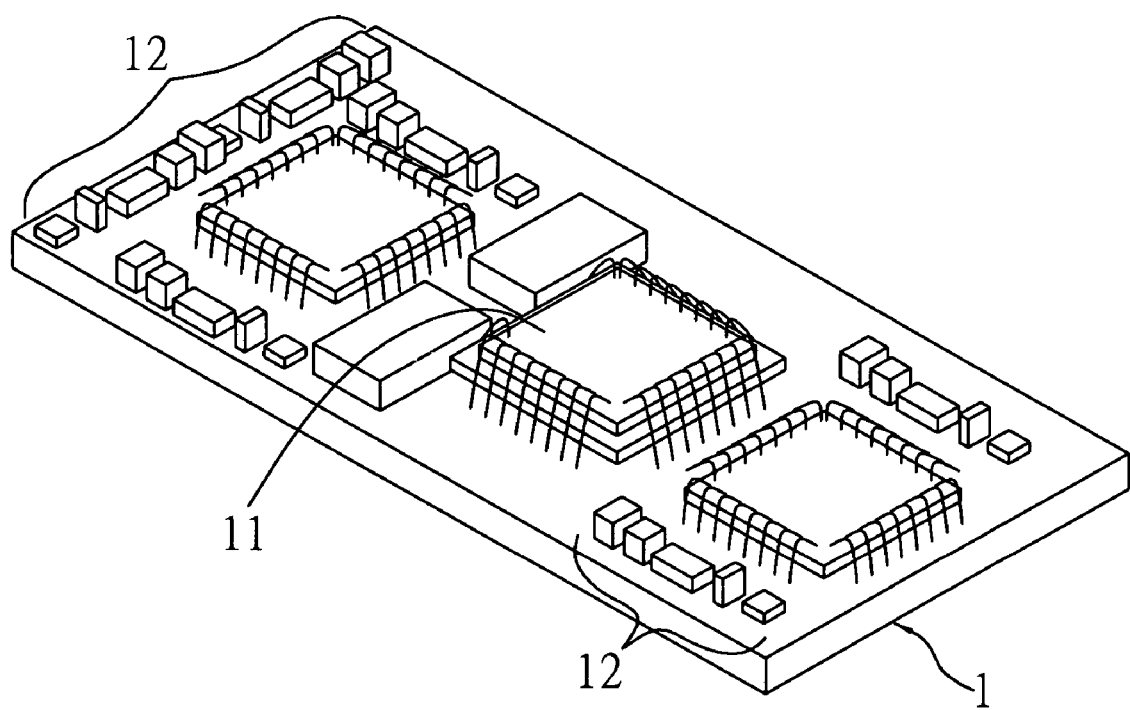
FIG. 1 (PRIOR ART) is a schematic diagram depicting the conventional method for disposing capacitor components on a circuit board surface.

The present invention is described in the following with specific embodiments, so that one skilled in the pertinent art can easily understand other advantages and effects of the present invention from the disclosure of the invention. The present invention may also be implemented and applied according to other embodiments, and the details may be modified based on different views and applications without departing from the spirit of the invention. In addition, the drawing and the components shown herein are not to scale and are made in simplicity with provision of only associated components related to the invention; in practical usage, the component should be more complexly structured and the number, size, shape and arrangement of each component can be varied accordingly.

First Preferred Embodiment

Figure 2A:
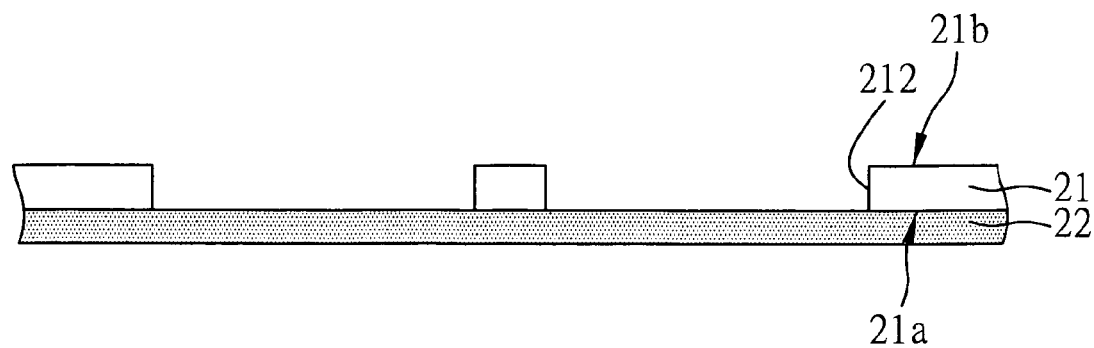
FIGS. 2A and 2F are schematic cross-sectional diagrams showing a substrate structure with embedded capacitor components and a method for fabricating the same in accordance with a first preferred embodiment of the present invention.
Figure 2B:
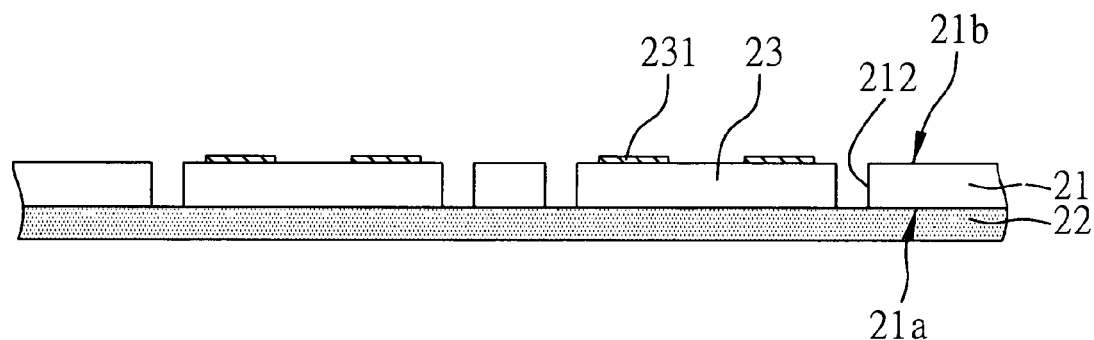

Referring to FIGS. 2A and 2B, a method for fabricating the substrate with embedded capacitor components proposed by the present invention is provided.

Referring to FIG. 2A, a substrate 21 having a first surface 21$a$, a second surface 21$b$, and at least one holes 212 penetrating the first surface 21$a$ and the second surface 21$b$. The substrate 21 is a multilayer circuit board having at least two circuit layers, insulating board or metallic board. A dielectric layer 22 is formed on the first surface 21$a$ of the substrate so as to seal off one end of the holes 212 of the substrate 21.

Referring to FIG. 2B, capacitor components 23 are accommodated within the holes 212 on the substrate 21 in such a way that the capacitor components 23 are disposed on the surface of the first dielectric layer 22, wherein at least one surface of the capacitor components 23 have a plurality of electrode pads 231 and the surfaces of the capacitor components 23 are treated with a surface roughness process prior to or after positioning in the holes 212 on substrate 21. The surface roughness process can be carried out using methods such as plasma etching, RIE or micro etching.

Figure 2C:
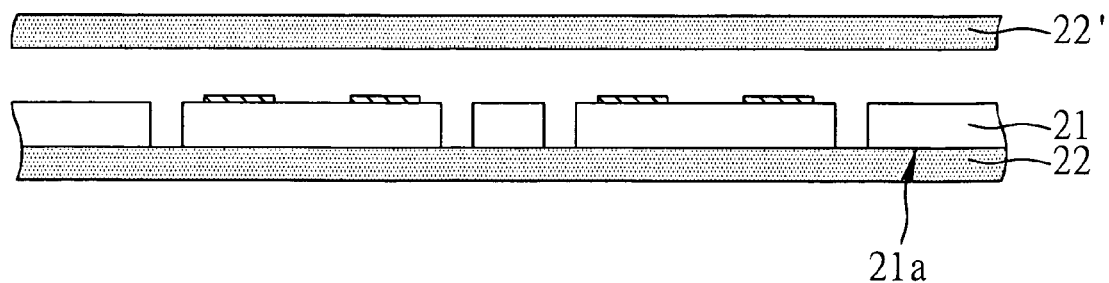
Figure 2D:
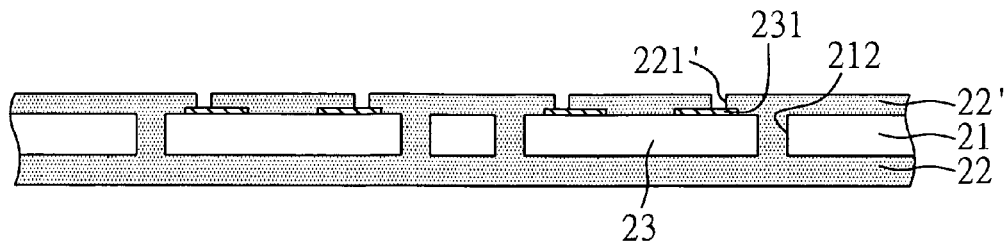

Referring to FIGS. 2C and 2D, a second dielectric layer 22' is formed on the second surface 21b of substrate 21 and the surface of the capacitor components 23, allowing the gap between the substrate 21 and capacitor components 23 to be filled with either one or both of the first dielectric layer 22 and second dielectric layer 22'. The materials of the first and second dielectric layer 22, 22' are selected from a group comprising a prepreg that contains high resin level, dielectric film or a combination of prepreg and dielectric film. An adhesive material may be used (not illustrated in any diagram) by filling it into the gap between the substrate 21 and capacitor components 23, so as to secure in position the capacitor components 23 in the hole 212 of the substrate 21. Moreover, openings 221' are formed in the second dielectric layer 22' so as to expose the electrode pad 231 of the capacitor components 23 thereto, the electrode pad 231 is made of a material selected from a group consisting Copper (Cu), Nickel (Ni), Tin (Sn), Ni—Cu, Nickel-Gold (Ni/Au) etc. Through the second dielectric layer 22' having high resin contents, The capacitor components 23 which are pretreated with a surface roughness process can be firmly secured in position in the hole 212 of the substrate 21. In addition, the capacitor components 23 can be made of ceramic, having both high in capacitance value and capacitance variation range (nF-µF), As the capacitor components 23 has a plurality of electrode pads 231, thus the capacitance values can be flexibly changed according to practical requirements, thereby improving the flexibility for circuitry layout design of the substrate 21.

Figure 2E:
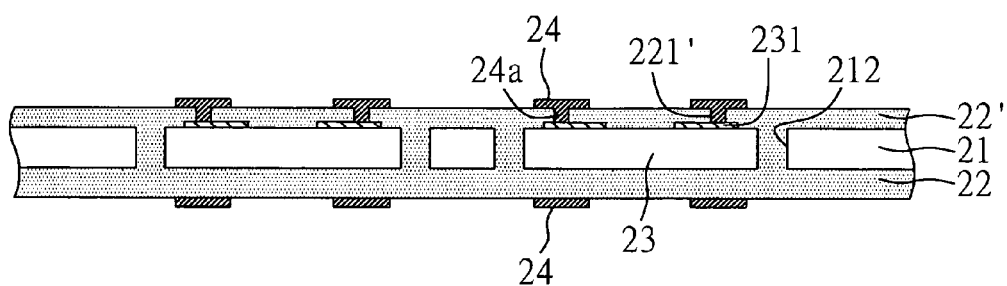

Referring to FIG. 2E, The circuit layers 24 are formed on the first and second dielectric layers 22, 22' respectively, and conductive structures 24a are formed in the openings 221' of the dielectric layer 22' so as to electrically connect the circuit layers 24 to the electrode pads 231 of the capacitor components 23 via the conductive structures 24a.

Figure 2F:
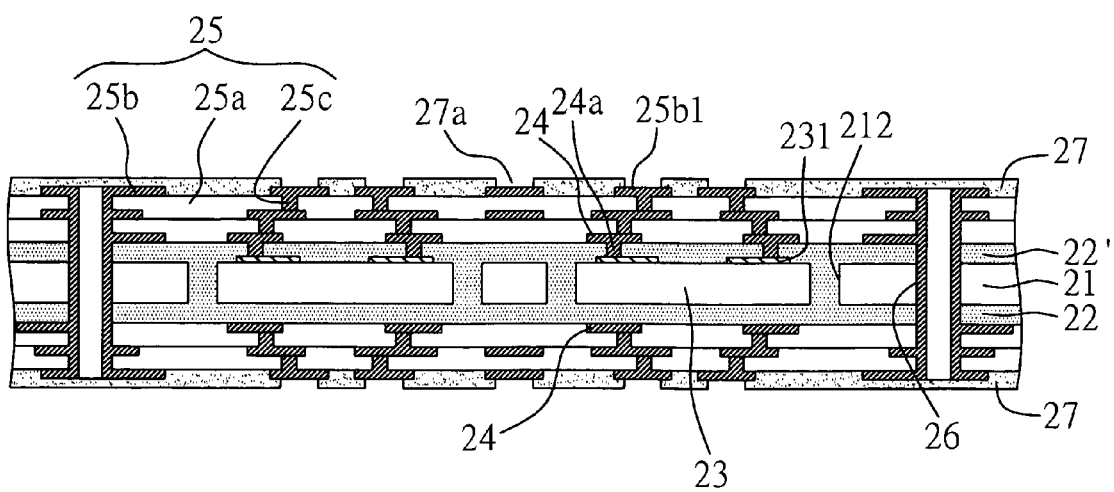

Referring to FIG. 2F, a circuit build-up structure 25 is formed on the first and second dielectric layers 22, 22' and the circuit layers 24. The circuit build-up structure 25 further comprises dielectric layers 25a, circuit layers 25b with electrical connection pads 25b1 stacked on the dielectric layers 25a, and conductive structures 25c (such as conductive vias) formed in the dielectric layers 25a for electrically connecting the circuit layers 24 to the conductive structures 25c of the circuit layers 25b. Then, a plurality of plated through holes 25 are formed penetrating the circuit layers 24 on the first and second dielectric layers 22, 22' of the first surface 21a and the second surface 21b of the substrate 21 and the circuit build up structure 25 thereon. Lastly a solder mask layer 27 is formed on the surface of the circuit build up structure 25 with a plurality of openings 27a on the surface thereof, for exposing the electrical connection pads 25b1 of the circuit build-up structure.

It should be noted that the build-up circuitry layer structure are not necessary limited by the number of layers in the drawings, rather the number of layers in the build-up circuit layer depends according to the practical requirements.

The substrate structure with embedded capacitor components formed using the foregoing fabricating method of the invention, comprising: a substrate 21 having at least one holes 212; capacitor components 23 accommodated in the holes of the substrate, wherein at least one surface of the capacitor components 23 have a plurality of electrode pads 231 and the surface of the capacitor components are pretreated with a surface roughness process; first and second dielectric layers 22, 22' formed on the surfaces of the substrate and capacitor components respectively, allowing the holes 212 of the substrate 21 to be filled with either one of or both the first dielectric layer 22 and second dielectric layer 22', so as to secure in position the capacitor components in the holes of the substrate, wherein the second dielectric layer 22 has openings 221 for exposing the electrode pads 231 of the capacitor components 23; and circuit layers 24 formed on the surfaces of the first and second dielectric layers 22, 22', wherein conductive structures 24a are formed in the openings 221' of the second dielectric layer 22', allowing the circuit layers 24 to be electrically connected to the electrode pads 231 of the capacitor components 23.

As shown in FIG. 2F, the forgoing substrate structure having embedded capacitor components further comprises a circuit build-up structure 25, solder mask layer 27 and plated through holes penetrating through the circuit layers 24 and circuit build up structure 25 on the first and second dielectric layers 22, 22' of the first and second surface 21a, 21b of the substrate 21. The circuit build-up structure 25 is formed on the surface of the first, second dielectric layers 22, 22' and circuit layers 24. A plurality of conductive structures 25c are formed in the circuit build-up structure for electrically connecting with the circuit layer 24 while electrical connections pads 25b1 are formed on the surface of the circuit build up structure 25. The circuit build-up structure 25 further comprises dielectric layers 25a, circuit layers 25b stacked on the dielectric layers 25a, and conductive structures 25c formed in the dielectric layers 25a. The solder mask layer 27 is formed on the surface of the circuit build-up structure, having a plurality of openings 27a for exposing the electrical connection pads 25b1 of the circuit build-up structure 25b1.

Second Preferred Embodiment

Figure 3:
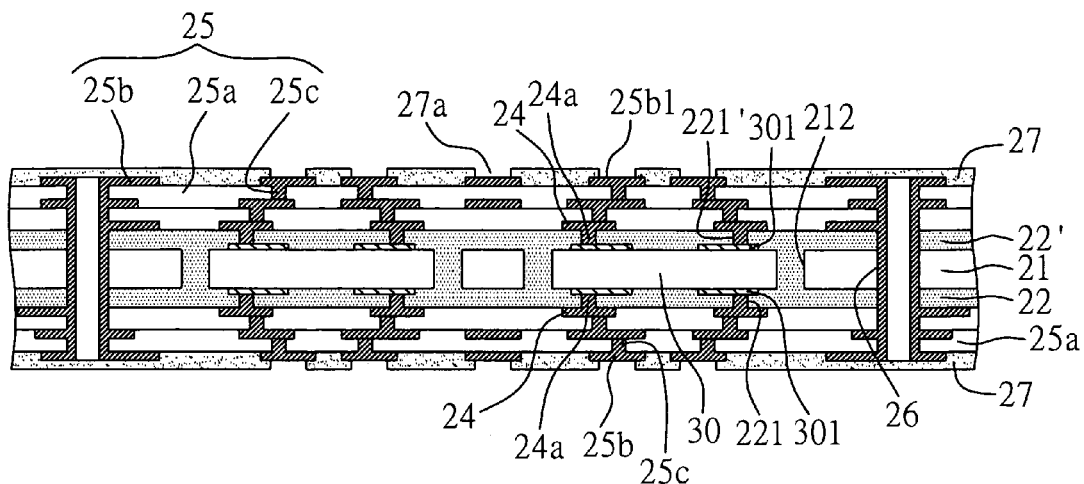
FIG. 3 is a schematic cross-sectional diagram showing a substrate structure with embedded capacitor components in accordance with a second preferred embodiment of the present invention.

Referring to FIG. 3, a schematic cross-sectional view of the substrate structure with embedded capacitor components in accordance with a second preferred embodiment of the invention is provided. The elements that are similar of closely related to the first embodiment are assigned with the same numbers for illustrating the specification in more clarity.

As illustrated by FIG. 3, the difference between the present embodiment and the first embodiment is that both surfaces of the capacitor components 30 have a plurality of electrode pads 301. As such, openings 221, 221' are formed on both the first and second dielectric layer 22, 22 for exposing the electrode pads 301 of the capacitor components 30. Moreover, conductive structures 24a are formed on both openings 221 and 221' for electrically connecting the circuit layers 24 to the electrode pads of the capacitor components 30. Since both surfaces of the capacitor components 30 have electrode pads 301, both the capacitance value and circuitry layout flexibility on the substrate are improving. The structures of the other elements and the fabricating method in this embodiment are the same as the first embodiment, thereby repetitive explanation are not given here.

Third Preferred Embodiment

Referring to diagram 4, a schematic cross-sectional view of the substrate structure with embedded capacitor components in accordance with a third preferred embodiment of the invention is provided. The elements that are similar of closely related to the first embodiment are assigned with the same numbers for illustrating the specification in more clarity.

Figure 4:
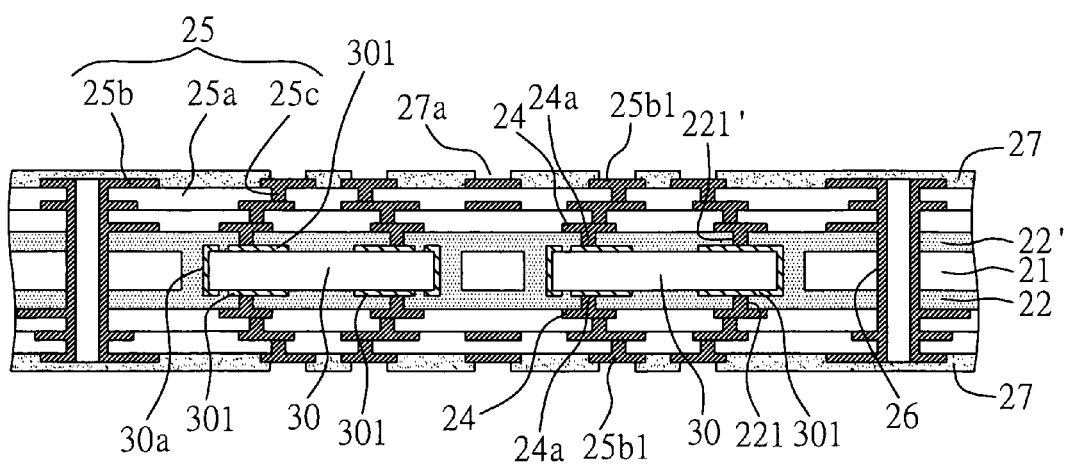
FIG. 4 is a schematic cross-sectional diagram showing a substrate structure with embedded capacitor components in accordance with a third preferred embodiment of the present invention

As illustrated by FIG. 4, the difference between the present embodiment and the first embodiment is that a metallic layer 30a is formed on the side of the capacitor components 30 which can be treated with a surface roughness process so as to further increase the bonding strength between the capacitor components 30 and the substrate 21. The structures of other elements and the fabricating method in this embodiment are the same as the first embodiment, thereby repetitive explanation are not given here.

In summary, the capacitor components embedded substrate structure and the method for fabricating the same involves performing a surface roughness process on the surfaces of the capacitor components so as to improve on the bonding strength between the capacitor components and the substrate. The capacitor components are secured in position by filling the gap between the capacitor components and the substrate with the first and second dielectric layers. Then circuit layers are formed on the first and second dielectric layers so as to form a module structure. Since the capacitor components are embedded within the substrate, the space within the substrate is fully utilized, which is beneficial in miniaturization of package size. Moreover, since the capacitor components have a plurality of electrode pads, capacitance value can be flexibly adjusted according to practical needs, thereby improving the flexibility of circuitry layout. Furthermore the module structure also allows it to be integrated with other electrical components or semiconductor devices, thereby simplifying the fabricating process.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A capacitor component-embedded substrate structure, comprising:
   a substrate having first and second surfaces and one or more holes penetrating the first and second surfaces;
   a capacitor component disposed in each of the one or more holes of the substrate, wherein the capacitor component has a plurality of electrode pads on at least one surface, and the at least one surface of the capacitor component is a rough surface, and wherein the capacitor component comprises a metallic roughness layer formed on a side of the capacitor component so as to increase bonding strength between the side of the capacitor component and walls of the holes of the substrate;
   first and second dielectric layers respectively formed on the surfaces of the substrate and capacitor components, allowing the capacitor components to be secured in position in the holes of the substrate, in which the dielectric layers have openings to expose the electrode pads of the capacitor components, and gaps between the substrate and the metallic roughness layer of the capacitor components are filled with either one or both of the first and second dielectric layers so as to secure in position the capacitor components in the holes of the substrate;
   circuit layers formed on the surface of the dielectric layers, having conductive structures in the openings of the dielectric layers, so as to allow the circuit layers to be electrically connected to the electrode pads of the capacitor components;
   a circuit build-up structure formed on the surface of the first and second dielectric layers and the circuit layers, wherein the circuit build-up structure further comprises dielectric layers, circuit layers stacked on the dielectric layers, and conductive structures formed in the dielectric layers, in which the conductive structures are formed in the circuit build-up structure so as to be electrically connected to the circuit layer on the surface of the first and second dielectric layers while electrical connection pads are formed on the surface of the circuit build-up structure; and
   a plurality of plated through holes penetrating the circuit layers on the first and second surfaces of the substrate and the circuit build-up structure.

2. The capacitor component-embedded substrate structure of claim 1, further comprising a solder mask layer formed on the surface of the circuit build-up structure, with a plurality of openings thereon for exposing the electrical connection pads of the circuit build-up structure.

3. A capacitor component-embedded substrate structure, comprising:
   a substrate having first and second surfaces and one or more holes penetrating the first and second surfaces;
   a capacitor component disposed in each of the one or more holes of the substrate, wherein the capacitor component has a plurality of electrode pads on at least one surface, and the at least one surface of the capacitor component is a rough surface, and wherein the capacitor component comprises a metallic roughness layer formed on a side of the capacitor component so as to increase bonding strength between the side of the capacitor component and walls of the holes of the substrate;
   first and second dielectric layers respectively formed on the surfaces of the substrate and capacitor components, allowing the capacitor components to be secured in position in the holes of the substrate, in which the dielectric layers have openings to expose the electrode pads of the capacitor components, and gaps between the substrate and the metallic roughness layer of the capacitor components are filled with an adhesive material so as to secure in position the capacitor components in the holes of the substrate;
   circuit layers formed on the surface of the dielectric layers, having conductive structures in the openings of the dielectric layers, so as to allow the circuit layers to be electrically connected to the electrode pads of the capacitor components;
   a circuit build-up structure formed on the surface of the first and second dielectric layers and the circuit layers, wherein the circuit build-up structure further comprises dielectric layers, circuit layers stacked on the dielectric layers, and conductive structures formed in the dielectric layers, in which the conductive structures are formed in the circuit build-up structure so as to be electrically connected to the circuit layer on the surface of the first and second dielectric layers while electrical connection pads are formed on the surface of the circuit build-up structure; and
   a plurality of plated through holes penetrating the circuit layers on the first and second surfaces of the substrate and the circuit build-up structure.

4. The capacitor component-embedded substrate structure of claim 3, further comprising a solder mask layer formed on the surface of the circuit build-up structure, with a plurality of openings thereon for exposing the electrical connection pads of the circuit build-up structure.

* * * * *